United States Patent
Li et al.

(10) Patent No.: US 6,379,014 B1
(45) Date of Patent: Apr. 30, 2002

(54) GRADED ANTI-REFLECTIVE COATINGS FOR PHOTOLITHOGRAPHY

(75) Inventors: Guoguang Li, San Jose; Dale A. Harrison, Tracy; Abdul Rahim Forouhi, Cupertino, all of CA (US)

(73) Assignee: N & K Technology, Inc., Santa Clara, CA (US)

( * ) Notice: Subject to any disclaimer, the term of this patent is extended or adjusted under 35 U.S.C. 154(b) by 0 days.

(21) Appl. No.: 09/560,504

(22) Filed: Apr. 27, 2000

(51) Int. Cl.$^7$ ............................................... G02B 1/11

(52) U.S. Cl. ................... 359/614; 359/580; 430/272.1; 430/311; 428/638

(58) Field of Search ................................. 359/614, 580, 359/586, 589; 430/271.1, 272.1, 311; 438/618, 636

(56) References Cited

U.S. PATENT DOCUMENTS

| | | | |
|---|---|---|---|
| 3,833,368 A | 9/1974 | Land et al. ...................... | 96/3 |
| 4,102,683 A | 7/1978 | DiPiazza ........................ | 96/38.4 |
| 4,465,337 A | 8/1984 | Baron et al. ................... | 350/164 |
| 4,568,140 A | 2/1986 | Van der Werf et al. ........ | 350/1.6 |
| 4,583,822 A | 4/1986 | Southwell ...................... | 350/164 |
| 4,778,251 A | 10/1988 | Hall et al. ..................... | 350/166 |
| 4,826,267 A | 5/1989 | Hall et al. ..................... | 350/1.6 |
| 4,934,788 A | 6/1990 | Southwell ...................... | 350/164 |
| 5,415,953 A | * 5/1995 | Alpay et al. ................... | 430/5 |
| 5,459,002 A | * 10/1995 | Alpay et al. ................... | 430/5 |
| 5,811,191 A | 9/1998 | Nueman ......................... | 428/427 |

OTHER PUBLICATIONS

Singer, P. "Anti–Reflective Coatings: A Story of Interfaces [Lithography]," Semiconductor International V.32, No. 3, Mar. 1999, pp. 55–56, 58, 60.

He, Q et al., "Inorganic Antireflective Coating Process for Deep–UV Lithography," SPIE, V. 3334, pp. 337–346, (1998).

Cirelli, R.A. et al. "A Multilayer Inorganic Antireflective System for Use in 248nm Deep Ultraviolet Lithography," J. of Vacuum Science and Technology B, V.14, No. 6, Nov./Dec. 1996, pp. 4229–4233.

Lian, S. et al. "New Characterization Technique for SiON AR Coatings," Semiconductor International, Jul. 1998.

Gaillard, F. et al. "Physical and Optical Properties of an Antireflective Layer based on $SiO_xN_y$," J. Vac. Sci. Tech. A, V15, No. 5, Sep./Oct. 1997, pp.2777–2780.

Xu, M. et al. "Double–layer Inorganic Antireflective System for KrF Lithography," J. Cac. Sci. Tech. V18, No. 1, Jan./Feb. 2000, pp. 127–135.

(List continued on next page.)

*Primary Examiner*—Jon Henry
(74) *Attorney, Agent, or Firm*—Lumen Intellectual Property Services, Inc.

(57) ABSTRACT

A graded anti-reflective coating (ARC) with one or more layers has a bottom layer that is highly absorbing at the lithographic wavelength, and one or more layers between the substrate and the resist layer having inhomogeneous optical constants. The refractive indices are matched across layer interfaces, and the optical constants vary smoothly through the layer thicknesses. In each layer the extinction coefficient and the refractive index have independently selectable values and gradients. This ARC structure provides almost total absorption in the bottom layer and near-zero reflection at the resist interface and all other intermediate interfaces. Layers are preferably of inorganic materials, typically $SiO_xN_y$. Because of its highly absorbing bottom layer, an ARC according to an embodiment of the present invention works effectively over diverse substrate materials for a variety of lithographic wavelengths. It provides great latitude of manufacturing tolerances for thicknesses and optical constants.

12 Claims, 6 Drawing Sheets

OTHER PUBLICATIONS

Callard, S., "Fabrication and characterization of graded refractive index silicon oxynitride thin films," J. Vac. Sci. Tech., 15(4), pp. 2088–2093, 1997.

Szczyrborski, J. et al. "On the Determination of Optical Constants of Films," J. Phys. D: Apply. Physl. V12, 1979, pp. 1737–1751.

Ouellette, M.F. et al. "Experimental Studies of Inhomogeneous Coatings for Optical Applications," J. Vac. Sci. Tech. V9, No. 2, May/Jun. 1991, pp. 1188–1192.

Dobrowolski, J., "Optical propertiesof films and Coatings," Handbook of Optics, McGraw Hill, pp. 42.19–42.34, 1995.

* cited by examiner

GRADED ANTI-REFLECTIVE COATINGS FOR PHOTOLITHOGRAPHY

FIELD OF THE INVENTION

This invention relates generally to the design of anti-reflective coatings for lithography. More particularly, it relates to gradient anti-reflective coatings for lithography.

BACKGROUND ART

As the feature size of an integrated circuit (IC) shrinks, anti-reflective coatings (ARC) play an important role in critical dimension (CD) control (see for example Singer, "Anti-Reflective Coatings: A Story of Interfaces," Semiconductor International, March 1999; Lian et al., "New Characterization Technique for SiON AR Coatings," Semiconductor International, July 1998; and Gaillard et al., "Physical and Optical Properties of an Anti-Reflective Layer Based on $SiO_xN_y$," J. Vac. Sci. Technol, Vol. A 15(5), 1997, p. 2777).

An ARC is positioned between a photoresist layer and a substrate and is designed to prevent or minimize the standing wave and swing curve effects in photolithographic patterning. The standing wave is the light intensity profile as a function of depth inside a given photoresist for a given thickness. It is the sinusoidal change due to the interference of the reflected light from the top and bottom interfaces of the resist. The swing curve is the change of clearing dose (the amount of light needed to develop the resist) as a function of resist thickness due to the standing wave effect within the resist, which varies as a function of resist thickness (see for example Cirelli et al., "A Multilayer Inorganic Anti-Reflective System for Use in 248 nm Deep Ultraviolet Lithography," J. Vac. Sci. Technol. B 14(6), 1996, p. 4229). The swing curve can be measured using a stepper or it can be calculated. A typical simulation is described in Mark, "Analytical Expression for the Standing Wave Intensity in Photoresist," Appl. Optics 25, 1986, p. 1958. The effects of standing waves in ridges of patterned photoresist can also be visualized with a scanning electron microscope (SEM).

A substrate generally consists of a variety of materials, for example silicon, aluminum, polysilicon, silicon oxide, tungsten silicide, and/or copper, arranged in a mosaic type pattern.

Currently used ARCs can be classified into two types in terms of film stacks: single layer and multilayer. For a single layer ARC, the film can be organic or inorganic. Organic films work by matching the refractive index of the ARC layer with that of the resist so that there is minimal light reflected at the resist/ARC interface. These organic films are usually designed to be quite thick, e.g., 100 nm (1000 Å) or more, and absorptive at the exposure wavelength, such that no light is reflected back from the ARC/substrate interface to the resist/ARC interface.

FIG. 1 is a graphic representation illustrating standing wave amplitude reduction in a conventional ARC model, having parameters shown in Table 1, at an exposure wavelength of 248 nm. A dashed curve 102 represents the standing wave pattern for a resist coated on a thick ARC ($SiO_xN_y$) layer. For the case of FIG. 1, the ARC layer is opaque at the exposure wavelength, and the ARC/Si interface does not contribute to the standing waves. Since the refractive indices of the ARC and the resist are substantially identical, the oscillation amplitude of the standing waves is correspondingly small. For comparison, a solid curve 104 represents the standing wave pattern for a resist directly coated on a Si substrate without an ARC. The ARC advantageously lowers the standing wave amplitude, but is quite thick (500 nm), adversely affecting high feature resolution.

TABLE 1

Model for standing wave calculation in FIG. 1

| Layer | Material | n @ 248 nm | k @ 248 nm | Thickness (Å) |
| --- | --- | --- | --- | --- |
| Incident medium | Air | 1.000 | 0.000 | |
| 1 | DUV resist | 1.860 | 0.010 | 7000 |
| 2 | $SiO_xN_y$ | 1.860 | 0.240 | 5000 |
| Substrate | Si | 1.570 | 3.566 | |

On the other hand, inorganic ARC films are generally based on the principle of destructive interference. This is done by adjusting the optical constants (refractive index n and extinction coefficient k) and the film thickness, such that the exposure radiation that is transmitted through the resist/ARC interface and then reflected back to the resist has a similar amplitude but is 180 degrees out of phase relative to the radiation that is directly reflected from the resist/ARC interface. To achieve this condition, a single layer film must be tightly controlled in its thickness and its optical constants. $SiO_xN_y$ is commonly used in an inorganic ARC. However, it is not a trivial task to find a material that can generate an exact destructive interference for a given resist on a complex substrate at a particular exposure wavelength.

To overcome this difficulty, multilayer ARCs consisting of at least two layers (typically $SiO_xN_y$) are used. Typically, the upper layer is used to generate conditions for destructive interference, whereas the lower layer is designed to absorb light at the exposure wavelength. An alternative approach is to use three or more discrete layers and to allow for gradual steps in absorption to minimize the reflection coefficient at any film interface. Multilayer ARCs are powerful on one hand, but are more complicated to process on the other hand, as precise control of multiple thicknesses and optical properties is required.

What is needed in the art of photolithography is an ARC having a small thickness and a simple structure, consisting of a minimal number of layers, and which permits maximum latitude of dimensions, optical constants, and process control parameters. Further needed is such an ARC that works effectively over substrates consisting of a variety of material surfaces and is compatible with photoresist and oxide etch processes. Also needed is such an ARC that introduces minimum strain internally between layers and externally between the ARC and resist and/or substrate.

SUMMARY

The above needs are met by a graded anti-reflective coating (ARC) with a bottom layer that is highly absorbing at the lithographic wavelength, and with one or more layers between the bottom layer and the resist layer having inhomogeneous optical constant values through the thickness of the coating. The layer thicknesses and the values of the optical constants are preselected, such that the refractive indices at the lithographic wavelength are matched across the layer interfaces, and the optical constants vary smoothly through the layer thicknesses. In each layer the extinction coefficient and the refractive index have independently selectable values and gradients. This ARC structure provides almost total absorption in the bottom layer and near-zero reflection at the resist interface and all other intermediate interfaces of radiation at the lithographic wavelength. Preferred embodiments of the ARC contain two layers. In preferred embodiments, the optical constants of the bottom layer are homogeneously distributed, whereas in other embodiments they are smoothly varying through the bottom layer thickness. In preferred embodiments, the layers are formed of inorganic materials, typically $SiO_xN_y$. Layer thicknesses in a range from approximately 10 nm to 65 nm are typical. Some embodiments include a single absorptive layer having an extinction coefficient gradient.

Because of its highly absorbing bottom layer, an ARC according to an embodiment of the present invention works effectively over a substrate consisting of a mosaic type pattern of diverse materials, including aluminum, silicon, polysilicon, silicon oxide, tungsten silicide, and copper. It can be designed for a variety of lithographic wavelengths, including deep ultraviolet wavelengths 157 nm, 193 nm, 248 nm, and 365 nm. It provides interface reflectances of less 1.0 per cent with great latitude of manufacturing tolerances relating to layer thicknesses and optical constants.

BRIEF DESCRIPTION OF THE FIGURES

The present invention may be better understood, and its numerous objects, features, and advantages made apparent to those skilled in the art by referencing the accompanying drawings. For simplicity and ease of understanding, the use of similar reference symbols in different drawings indicates similar or identical items.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

In the description that follows, a DUV wavelength of 248 nm is used as an example to illustrate the features and performance of an inhomogeneous ARC, according to embodiments of the present invention. However, any other photolithographic exposure wavelength, for example 157 nm, 193 nm or 365 nm, can be used equally effectively with an appropriately configured ARC according to the embodiments.

For the calculations carried out here, the standing waves are treated as described in Mark, "Analytical expression for the standing wave intensity in photoresist", Applied Optics, 25, (1986) p. 1958, and inhomogeneity is treated in a manner similar to that described in Szczyrbowski et al., J. Phys. D: Appl. Phys. V12 (19979) pp. 1737–51, except that in the present description a linear instead of parabolic dependence of optical constants is used.

According to the present invention, an inhomogeneous ARC has optical constants changing continuously and smoothly from top to bottom, such that very little or no exposure radiation is reflected or scattered inside the ARC. At the top surface of the ARC, the optical constants of the ARC at the exposure wavelength are approximately or identically equal to those of the photoresist, to minimize reflection at the photoresist/ARC interface. The bottom material of the ARC is highly absorbing at the exposure wavelength, to minimize reflection from the ARC/substrate interface back into the photoresist.

Figure 2:
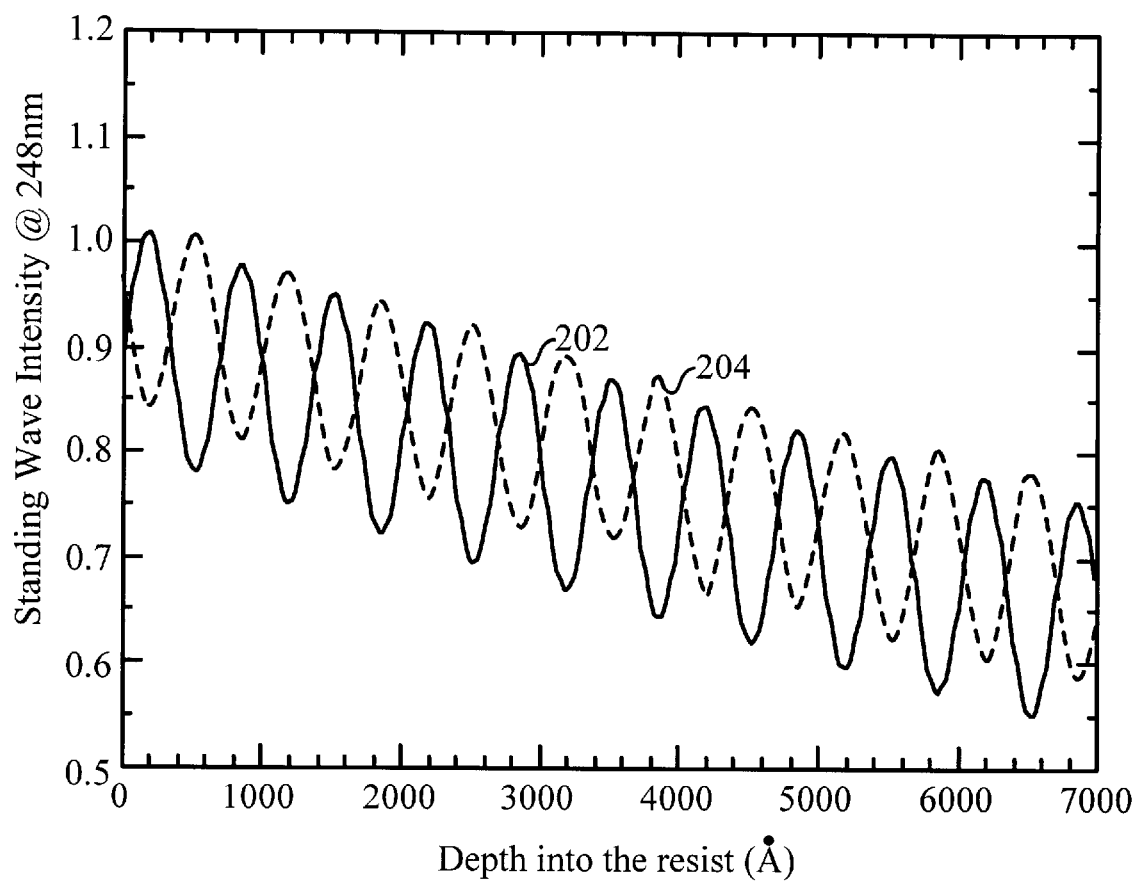
FIG. 2 is a graphic representation showing a comparison of standing waves between ARC models having the parameters shown in Tables 2 and 3.

FIG. 2 is a graphic representation showing a comparison of standing waves between ARC models having the parameters shown in Tables 2 and 3. A solid curve 202 represents the standing wave pattern for a resist coated on a conventional three-layer ARC, as detailed in Table 2. The overall thickness of the ARC layers is 70 nm (700 Å). The refractive indices of the three layers are stepped to reduce standing wave amplitude. A dashed curve 204 represents the standing wave pattern for a resist coated on a 40 nm (400 Å) single layer linear gradient inhomogeneousabsorptive ARC in accordance with an embodiment of the present invention, as detailed in Table 3. Homogeneous and inhomogeneous transparent ARCs are described in Bass (ed.), Handbook of Optics, Optical Society of America $2^{nd}$ edition, McGraw-Hill 1995, pp. 42.19–42.34. These transparent inhomogeneous ARCs are entirely different from the single gradient absorptive ARC layer illustrated by Table 3 and FIG. 2. Optical constants at the resist and substrate interfaces in Table 3 are not optimized, but are shown at the same values as in table 2.

TABLE 2

Model for standing wave calculation (solid curve) in FIG. 2

| Layer | Material | n @ 248 nm | k @ 248 nm | Thickness (Å) |
|---|---|---|---|---|
| Incident medium | Air | 1.000 | 0.000 | |
| 1 | DUV resist | 1.860 | 0.010 | 7000 |
| 2 | $SiO_xN_y$ | 1.860 | 0.240 | 150 |
| 3 | $SiO_xN_y$ | 1.950 | 0.450 | 250 |
| 4 | $SiO_xN_y$ | 2.120 | 1.00 | 300 |
| Substrate | Si | 1.570 | 3.566 | |

Figure 1:
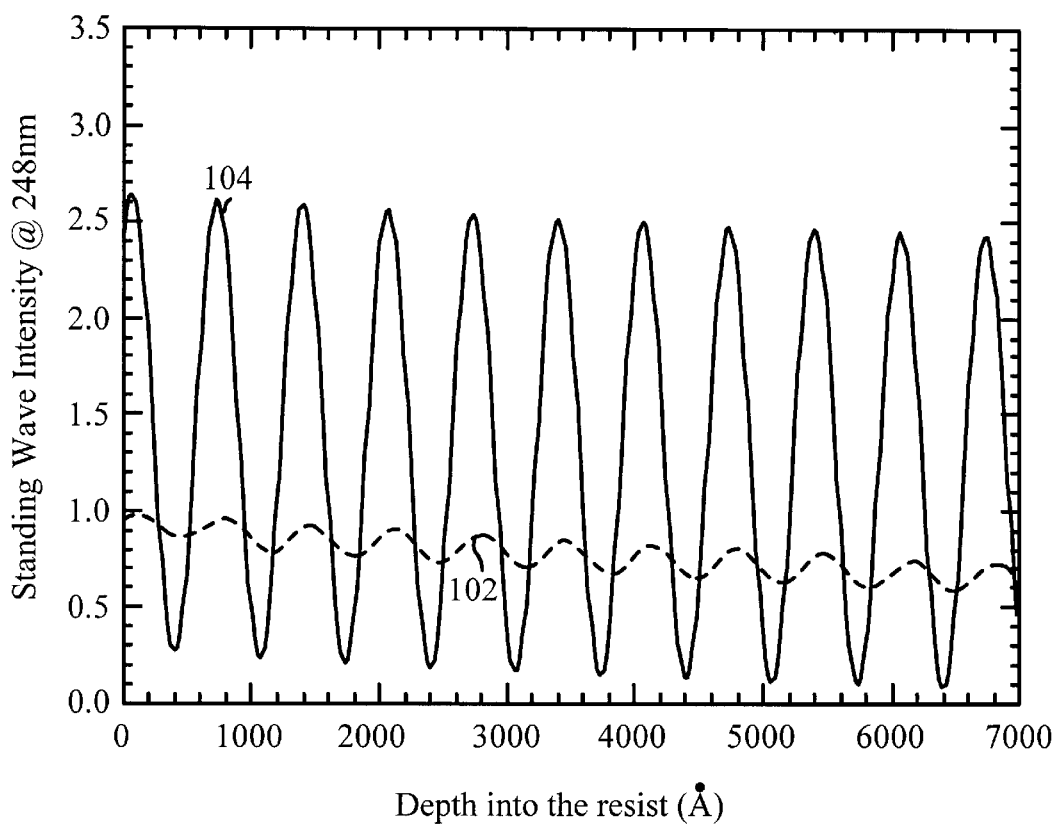
FIG. 1 is a graphic representation illustrating standing wave amplitude reduction in a conventional ARC model, having parameters shown in Table 1, at an exposure wavelength of 248 nm.

FIG. 2 clearly shows that a single gradient ARC layer according to an embodiment of the invention performs as well as or better than three discrete ARC layers, namely the standing wave oscillation amplitude is somewhat smaller and the total ARC structure is thinner. Comparing the peak-to-amplitudes in dashed curve 102 of FIG. 1 with those of dashed curve 204 of FIG. 2, it is apparent that the reflected light back into the resist, due to multiple reflections inside the ARC layer for the sample represented by dashed curve 204, is out of phase but about twice the intensity of light reflected back directly at the ARC/resist interface for the sample represented by dashed curve 102.

TABLE 3

Model for standing wave calculation
(dashed curve) in FIG. 2

| Layer | Material | n @ 248 nm | k @ 248 nm | Thickness (A) |
|---|---|---|---|---|
| Incident medium | Air | 1.000 | 0.000 | |
| 1 | DUV resist | 1.860 | 0.010 | 7000 |
| 2 | SiO$_x$N$_y$ | 1.860 (top) 2.12 (bottom) | 0.240 (top) 1.00 (bottom) | 400 |
| Substrate | Si | 1.570 | 3.566 | |

Figure 3:
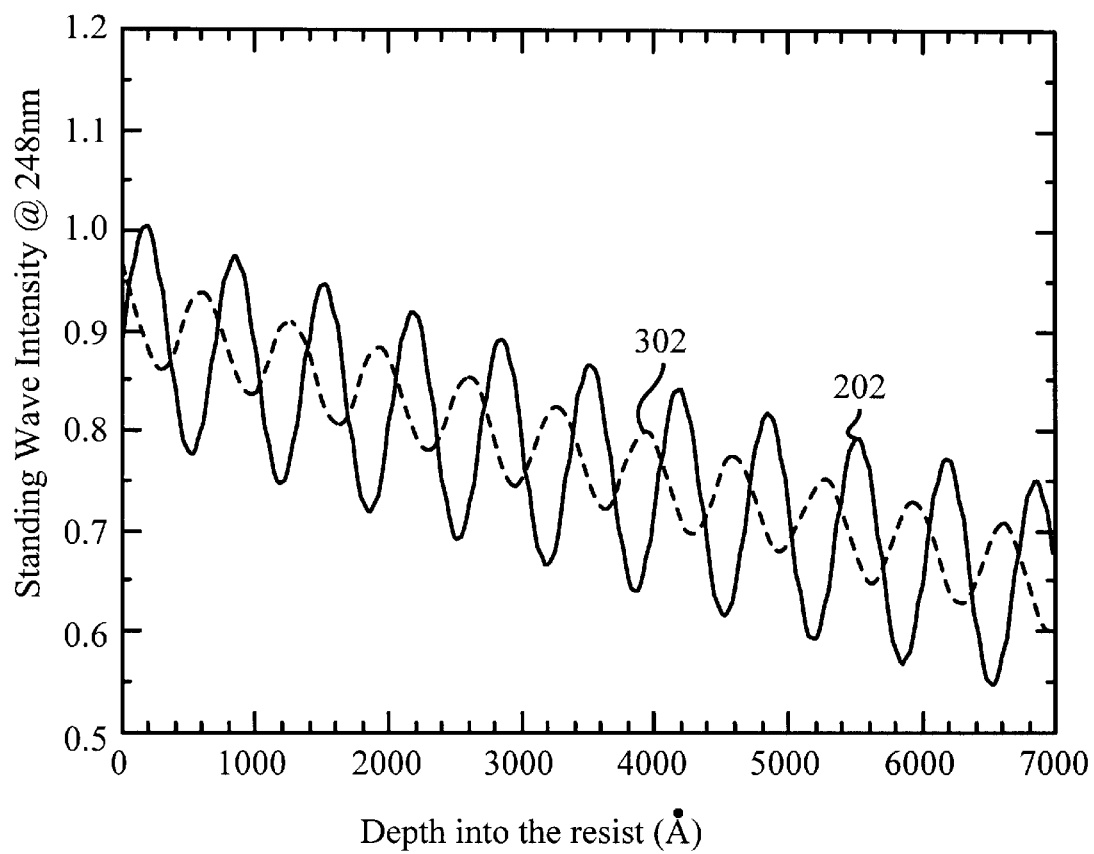
FIG. 3 is a graphic representation of standing wave intensity as a function of depth into the resist layer calculated using the parameters displayed in Table 4.

FIG. 3 is a graphic representation of standing wave intensity as a function of depth into the resist layer calculated using the parameters displayed in Table 4. A dashed curve 302 in FIG. 3 shows an improved standing wave intensity, using a two-layer ARC structure, according to an embodiment of the present invention. The detailed parameters are listed in Table 4. The optical constants of layer 2 at 248 nm change linearly from the top to the bottom in the top SiO$_x$N$_y$ and remain constant in the second SiO$_x$N$_y$ layer. Alternative inorganic ARC layer materials include, for example, SiN$_x$, SiO$_x$N$_y$C$_z$, SiO$_x$N$_y$H$_z$, MoSi$_x$O$_y$, and MoSi$_x$O$_y$N$_z$. For comparison, a solid curve 202 represents a standing wave intensity profile obtained using a prior art three-layer ARC structure described in connection with FIG. 2.

TABLE 4

Model for standing wave calculation
(dashed curve) in FIG. 3

| Layer | Material | n @ 248 nm | k @ 248 nm | Thickness (A) |
|---|---|---|---|---|
| Incident medium | Air | 1.000 | 0.000 | |
| 1 | DUV resist | 1.860 | 0.010 | 7000 |
| 2 | SiO$_x$N$_y$ | 1.860 (top) 2.12 (bottom) | 0.240 (top) 1.00 (bottom) | 150 |
| 3 | SiO$_x$N$_y$ | 2.12 | 1.0 | 250 |
| Substrate | Si | 1.570 | 3.566 | |

Figure 4:
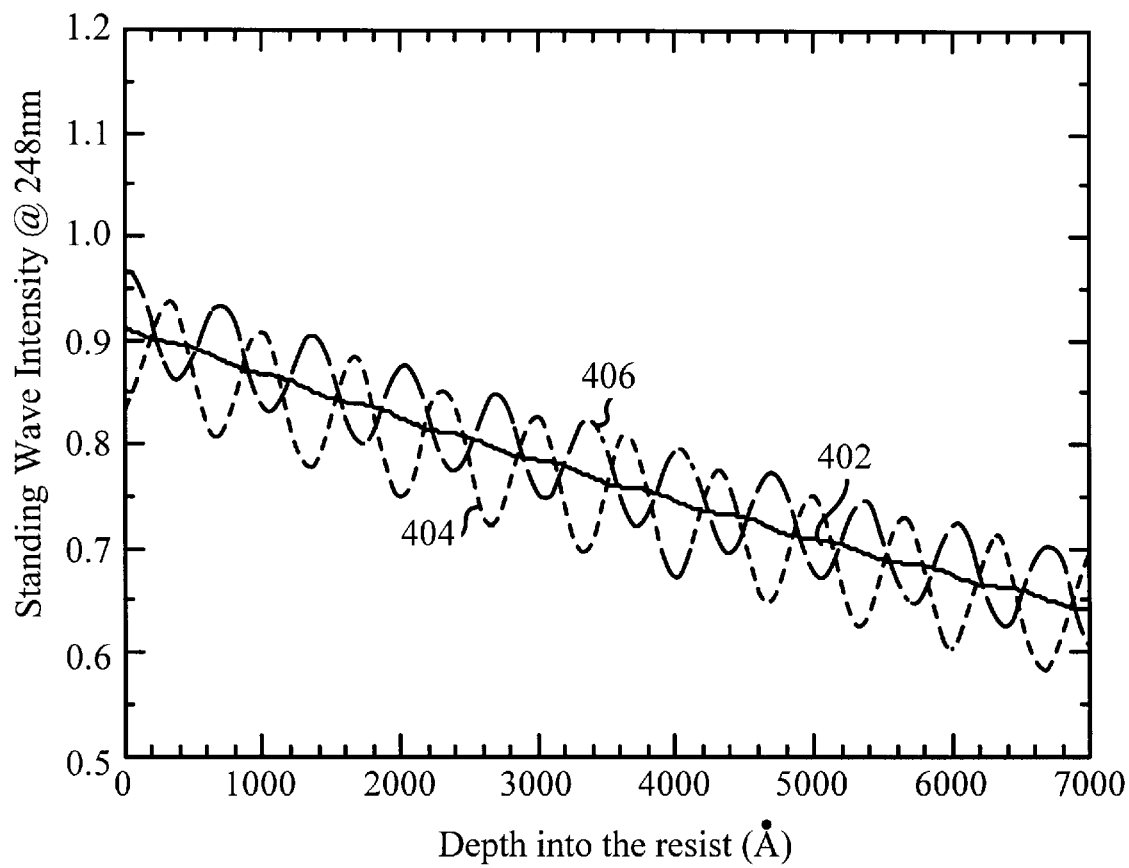
FIG. 4 is a graphic representation showing the standing wave intensity calculated using the parameters of a single-layer ARC displayed in Table 5.

In order to minimize the standing wave intensities, a highly Si-rich SiO$_x$N$_y$ material is used at the bottom of the ARC structure. FIG. 4 is a graphic representation showing the standing wave intensity calculated using the parameters of a single-layer ARC displayed in Table 5. A solid curve 402 represents an optimized layer thickness of 28.5 nm for an exposure wavelength of 248 nm. When the ARC thickness is significantly thinner (dashed curve 404) or thicker (broken curve 406) than 28.5 nm, the standing wave oscillations are still much smaller than those from the three homogeneous ARC layers (see solid curve in FIG. 2). This provides greater latitude in manufacturing tolerances.

When a conventional ARC uses destructive interference and is optimized for a one particular type of substrate, for example polysilicon, it usually will not work very well for other substrate materials, for example Al. That occurs because the reflection coefficient at the ARC/substrate interface varies with the optical properties of the substrate. When an ARC is applied over a composite substrate that has diverse material reflective surfaces in an arbitrary mosaic type pattern at multiple levels (see for example Singer, March 1999, cited above), a "universal ARC" is required that can work for a wide range of substrates.

TABLE 5

Model for standing wave calculation
(dashed curve) in FIG. 4

| Layer | Material | n @ 248 nm | k @ 248 nm | Thickness (A) |
|---|---|---|---|---|
| Incident medium | Air | 1.000 | 0.000 | |
| 1 | DUV resist | 1.860 | 0.010 | 7000 |
| 2 | SiO$_x$N$_y$ | 1.860 (top) 2.784 (bottom) | 0.240 (top) 1.893 (bottom) | 285 |
| Substrate | Si | 1.570 | 3.566 | |

Table 6 shows an example of a universal ARC, in accordance with an embodiment of the present invention. The ARC structure of Table 6 consists of two layers of ARC; the top layer has linearly graded optical constants and the bottom layer is a uniform film with very high absorption. Alternatively, the bottom layer can be an inhomogeneous film having varying optical constants through the bottom layer thickness. In the structure of Table 6, techniques known in the art are used to vary the refractive index independently of the extinction coefficient by varying the composition through the thickness of an inhomogeneous layer. Inorganic ARC layers are formed using a variety of conventional methods. A number of these are discussed in Xu et al. "Double-layer Inorganic Antireflective System for KrF Lithography," J. Vac. Sci. Tech. V18, no. 1, Jan/Feb 2000, pp. 127–35.

TABLE 6

Figure 5:
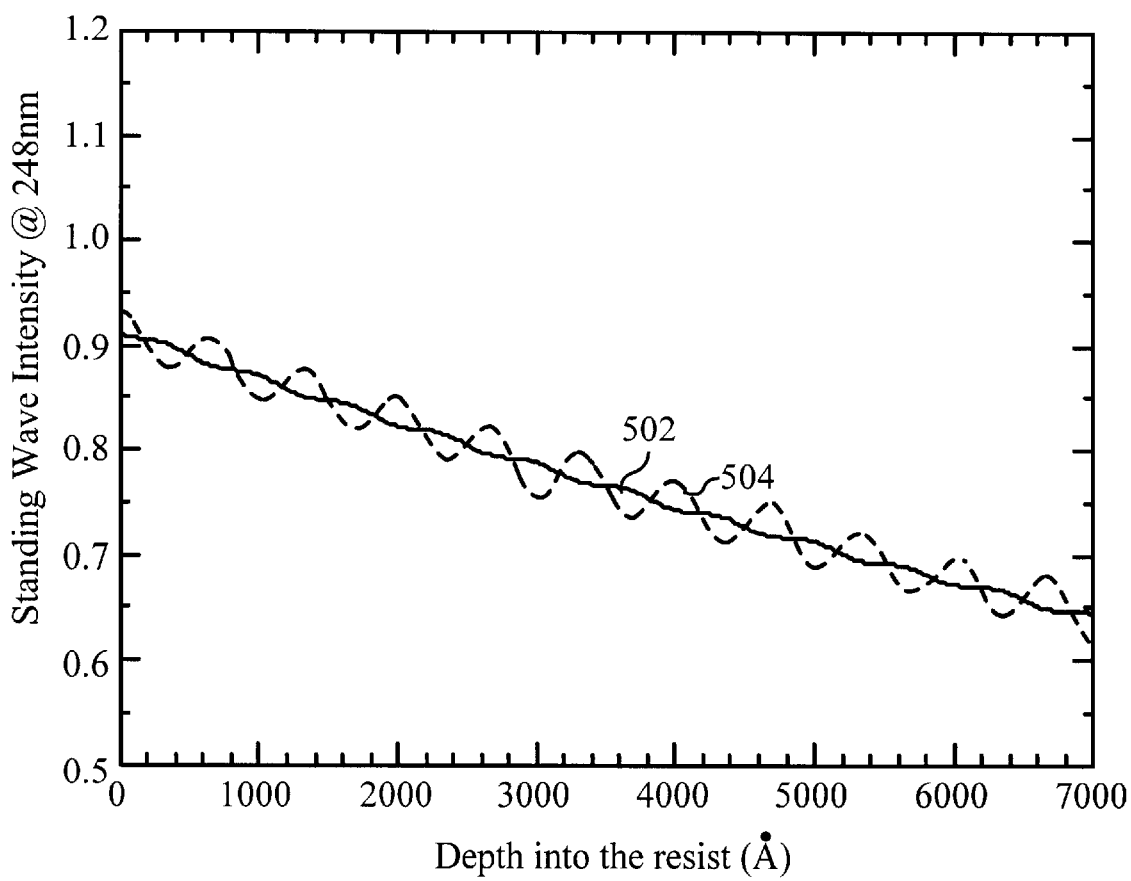
FIG. 5 is a graphic representation of the calculated standing wave for a structure of Table 6.

Model for standing wave calculation
(solid curve) in FIG. 5

| Layer | Material | n @ 248 nm | k @ 248 nm | Thickness (A) |
|---|---|---|---|---|
| Incident medium | Air | 1.000 | 0.000 | |
| 1 | DUV resist | 1.860 | 0.010 | 7000 |
| 2 | SiO$_x$N$_y$ | 1.860 (top) 2.784 (bottom) | 0.010 (top) 1.893 (bottom) | 200 |
| 3 | SiO$_x$N$_y$ | 2.784 | 1.893 | 400 |
| Substrate | Si | 1.570 | 3.566 | |

Figure 6:
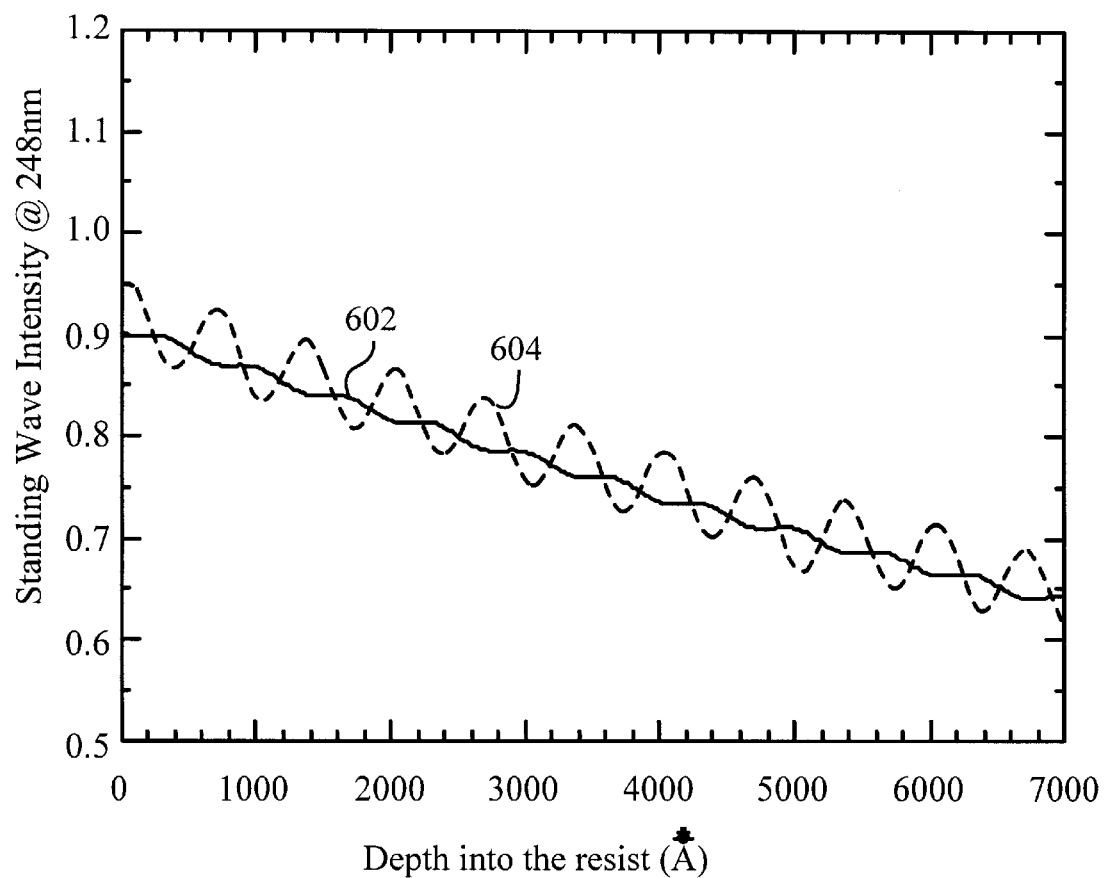
FIG. 6 is a graphic representation showing the standing wave pattern for the structure of Table 7.

FIG. 5 is a graphic representation of the calculated standing wave for a structure of Table 6 shown as a solid curve 502. In this structure, the standing wave is not sensitive to the film thickness, because the film is substantially opaque at 248 nm. When the total thickness (especially the second layer) is thicker than those shown in Table 6, the standing wave effects are further reduced. On the other hand, the standing wave oscillations are still very small, even if the thickness of the second layer is reduced to 200 Å, as shown in dashed curve 504 of FIG. 5. ARC structures of the type shown in Table 6 are applied effectively over a variety of substrate materials. For example, a typical substrate can consist of silicon, aluminum, polysilicon, silicon oxide, tungsten silicide, and/or copper, arranged in a mosaic type pattern. When a universal ARC of Table 6 is applied over an Al substrate (Table 7), it works effectively. FIG. 6 is a graphic representation showing the standing wave pattern for the structure of Table 7 (solid curve 602 shown in FIG. 6). It still works effectively, if the thickness of the second ARC layer is reduced to 200 Å (dashed curve 604 in FIG. 6).

TABLE 7

Model for standing wave calculation (solid curve) in FIG. 6

| Layer | Material | n @ 248 nm | k @ 248 nm | Thickness (Å) |
|---|---|---|---|---|
| Incident medium | Air | 1.000 | 0.000 | |
| 1 | DUV resist | 1.860 | 0.010 | 7000 |
| 2 | $SiO_xN_y$ | 1.860 (top) 2.784 (bottom) | 0.010 (top) 1.893 (bottom) | 200 |
| 3 | $SiO_xN_y$ | 2.784 | 1.893 | 400 |
| Substrate | Al | 0.190 | 2.942 | |

It is noted that the functionality of the ARC with a structure shown in Table 6 is not sensitive to the specific optical constant depth profile, as long as (1) the optical constants 20 at the top surface of the ARC are very close to those of resist; (2) The optical constants change smoothly inside the ARC; and (3) the bottom layer of ARC is highly absorptive and thick enough, such that the ARC structure as a whole can absorb substantially all of the light that is transmitted into the ARC layer.

Such an ARC structure provides a great latitude of manufacturing tolerances. For example, at an exposure wavelength of 248 nm, an ARC structure, in accordance with an embodiment of the present invention, can have a top layer with a thickness in a range from approximately 10 nm to approximately 50 nm. The top layer can have a refractive index ranging from greater than approximately 1.5 at the top surface to greater than approximately 2.0 at the bottom surface. Reflectances are in the range of 1.0 per cent or less at both top and bottom surfaces. Similarly the bottom layer thickness can range from approximately 15 nm to any greater thickness, with an extinction coefficient in a range of greater than approximately 1.5. Moreover, an ARC structure according to the present invention can be implemented with a range of stoichiometries of a single basic layer material selected from a group of such materials. This simplifies post-lithographic processes, for example photoresist and oxide etch processes.

In addition to relaxing process tolerances, the ARC structure according to the present invention allows maximum suppression of reflections with a minimum number of layers, one or two layers being adequate. Layer thickness is minimized by providing optical constant gradients through the thickness of a layer. Further, the highly absorbing bottom layer works effectively over substrates consisting of a variety of material surfaces in a mosaic type pattern, as typically encountered in photolithography. Moreover, the present ARC minimizes strain in the structure by matching the optical constants at the interfaces between layers, thereby effectively removing discontinuities that otherwise cause stress due to differential thermal expansion at the interfaces.

It will be clear to one skilled in the art that the above embodiments may be altered in many ways without departing from the scope of the invention. Accordingly, the scope of the invention should be determined by the following claims and their legal equivalents.

What is claimed is:

1. A graded anti-reflective coating for photolithography at a preselected exposure wavelength, comprising:
    (a) a layer overlying a substrate, said layer having a preselected thickness, a top surface, and a bottom surface interfacing with said substrate, wherein said layer comprises an inorganic material and said inorganic material comprises $SiO_xN_y$;
    (b) said layer having an extinction coefficient preselected to absorb substantially all radiation of the preselected exposure wavelength entering through said top surface and propagating through said preselected thickness of said layer; and
    (c) said extinction coefficient being preselected to vary smoothly and inhomogeneously through said preselected thickness.

2. The anti-reflective coating of claim 1, wherein said extinction coefficient at said bottom surface is greater than 1.5 at an exposure wavelength of 248 nm.

3. A graded anti-reflective coating for photolithography at a preselected exposure wavelength, comprising:
    (a) a layer overlying a substrate, said layer having a preselected thickness, a top surface, and a bottom surface interfacing with said substrate, wherein said layer comprises an inorganic material and said inorganic material comprises $SiN_x$;
    (b) said layer having an extinction coefficient preselected to absorb substantially all radiation of the preselected exposure wavelength entering through said top surface and propagating through said preselected thickness of said layer; and
    (c) said extinction coefficient being preselected to vary smoothly and inhomogeneously through said preselected thickness.

4. The anti-reflective coating of claim 3, wherein said extinction coefficient at said bottom surface is greater than 1.5 at an exposure wavelength of 248 nm.

5. A graded anti-reflective coating for photolithography at a preselected exposure wavelength, comprising:
    (a) a layer overlying a substrate, said layer having a preselected thickness, a top surface, and a bottom surface interfacing with said substrate, wherein said layer comprises an inorganic material and said inorganic material comprises $SiO_xN_yH_z$;
    (b) said layer having an extinction coefficient preselected to absorb substantially all radiation of the preselected exposure wavelength entering through said top surface and propagating through said preselected thickness of said layer; and
    (c) said extinction coefficient being preselected to vary smoothly and inhomogeneously through said preselected thickness.

6. The anti-reflective coating of claim 5, wherein said extinction coefficient at said bottom surface is greater than 1.5 at an exposure wavelength of 248 nm.

7. A graded anti-reflective coating for photolithography at a preselected exposure wavelength, comprising:
    (a) a layer overlying a substrate, said layer having a preselected thickness, a top surface, and a bottom surface interfacing with said substrate, wherein said layer comprises an inorganic material and said inorganic material comprises $SiO_xN_yH_z$;
    (b) said layer having an extinction coefficient preselected to absorb substantially all radiation of the preselected exposure wavelength entering through said top surface and propagating through said preselected thickness of said layer; and
    (c) said extinction coefficient being preselected to vary smoothly and inhomogeneously through said preselected thickness.

8. The anti-reflective coating of claim 7, wherein said extinction coefficient at said bottom surface is greater than 1.5 at an exposure wavelength of 248 nm.

9. A graded anti-reflective coating for photolithography at a preselected exposure wavelength, comprising:
   (a) a layer overlying a substrate, said layer having a preselected thickness, a top surface, and a bottom surface interfacing with said substrate, wherein said layer comprises an inorganic material and said inorganic material comprises $MoSi_xO_y$;
   (b) said layer having an extinction coefficient preselected to absorb substantially all radiation of the preselected exposure wavelength entering through said top surface and propagating through said preselected thickness of said layer; and
   (c) said extinction coefficient being preselected to vary smoothly and homogeneously through said preselected thickness.

10. The anti-reflective coating of claim 9, wherein said extinction coefficient at said bottom surface is greater than 1.5 at an exposure wavelength of 248 nm.

11. A graded anti-reflective coating for photolithography at a preselected exposure wavelength, comprising:
   (a) a layer overlying a substrate, said layer having a preselected thickness, a top surface, and a bottom surface interfacing with said substrate, wherein said layer comprises an inorganic material and said inorganic material comprises $MoSi_xO_yN_z$;
   (b) said layer having an extinction coefficient preselected to absorb substantially all radiation of the preselected exposure wavelength entering through said top surface and propagating through said preselected thickness of said layer; and
   (c) said extinction coefficient being preselected to vary smoothly and inhomogeneously through said preselected thickness.

12. The anti-reflective coating of claim 11, wherein said extinction coefficient at said bottom surface is greater than 1.5 at an exposure wavelength of 248 nm.

* * * * *